United States Patent
Zhang

(10) Patent No.: US 12,484,173 B2
(45) Date of Patent: Nov. 25, 2025

(54) ELECTRONIC DEVICE

(71) Applicant: PEGATRON CORPORATION, Taipei (TW)

(72) Inventor: Jun-Feng Zhang, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 157 days.

(21) Appl. No.: 18/393,806

(22) Filed: Dec. 22, 2023

(65) Prior Publication Data

US 2024/0310786 A1  Sep. 19, 2024

(30) Foreign Application Priority Data

Mar. 17, 2023 (TW) ................. 112110128

(51) Int. Cl.
*H05K 5/06* (2006.01)
*H05K 5/04* (2006.01)

(52) U.S. Cl.
CPC ............. *H05K 5/061* (2013.01); *H05K 5/04* (2013.01)

(58) Field of Classification Search
CPC ........ G04B 37/106; G04G 17/08; H05K 5/04; H05K 5/061
See application file for complete search history.

(56) References Cited

U.S. PATENT DOCUMENTS

| | | | | |
|---|---|---|---|---|
| 6,396,771 B2 * | 5/2002 | Paratte | ............ | G04C 10/00 368/203 |
| 8,608,372 B2 * | 12/2013 | Koshoji | ............ | G04G 17/06 368/308 |
| 2014/0353072 A1 * | 12/2014 | Sato | ............ | B60G 7/006 180/445 |
| 2020/0110365 A1 * | 4/2020 | Hitsumoto | ............ | G04B 3/048 |
| 2022/0043397 A1 | 2/2022 | Ely et al. | | |

FOREIGN PATENT DOCUMENTS

| | | | |
|---|---|---|---|
| CN | 208014588 U | 10/2018 |
| CN | 211743035 U | 10/2020 |
| CN | 217134243 U | 8/2022 |

* cited by examiner

*Primary Examiner* — Sagar Shrestha
(74) *Attorney, Agent, or Firm* — McClure, Qualey & Rodack, LLP

(57) ABSTRACT

An electronic device includes a shell, a button member, a sleeve member, a waterproof ring, and a circuit board. The shell is made of a metal material, and the shell includes a mounting hole. The button member is made of a metal material, the button member includes a cap and a shaft body, the cap is located on an outer side of the shell, the shaft body passes through the mounting hole, and the shaft body includes a first end and a second end. The sleeve member is made of a heat shrinkable plastic material, and the sleeve member wraps the shaft body tightly. The waterproof ring is sleeved on the shaft body. The circuit board is disposed inside the shell, and the second end of the shaft body is movably in contact with or away from the circuit board.

8 Claims, 3 Drawing Sheets

ELECTRONIC DEVICE

CROSS-REFERENCE TO RELATED APPLICATION

This application claims the priority benefit of Taiwan application serial no. 112110128, filed on Mar. 17, 2023. The entirety of the above-mentioned patent application is hereby incorporated by reference herein and made a part of this specification.

TECHNICAL FIELD

Provided is an electronic device, and in particular an electronic device using a heat shrinkable sleeve on a button member.

BACKGROUND

Common smart wearable products, such as a smart watch, allow a user to press a metal button with a finger to send a signal to a main board for electrocardiogram measurement.

However, when a shell of the smart watch is made of a metal material, contact between the metal button and the metal shell may cause a short circuit, affecting conduction of a skin voltage and causing a measurement error. In addition, if a distance between the metal button and the metal shell is intended to be increased to avoid contact, the space between the metal button and the metal shell may be too large, causing shaking of the metal button or an increase of an overall volume.

SUMMARY

In view of this, according to an embodiment, an electronic device is provided. The electronic device includes a shell, a button member, a sleeve member, a waterproof ring, and a circuit board. The shell is made of a metal material, and the shell includes a mounting hole. The button member is made of a metal material, the button member includes a cap and a shaft body, the cap is located on an outer side of the shell, the shaft body passes through the mounting hole, and the shaft body includes a first end and a second end. The sleeve member is made of a heat shrinkable plastic material, and the sleeve member wraps the shaft body tightly. The waterproof ring is sleeved on the shaft body. The circuit board is disposed inside the shell, and the second end of the shaft body is movably in contact with or away from the circuit board.

In some embodiments, an insulating sheet and a buckle are further included, the insulating sheet is sleeved on the second end of the shaft body that is away from the cap and closely attached on an inner side wall surface of the shell, and the buckle is sleeved on the second end and is adjacent to the insulating sheet.

In some embodiments, the sleeve member includes a first sleeve portion and a second sleeve portion, the first sleeve portion is adjacent to the first end, the second sleeve portion is adjacent to the second end, and the waterproof ring is disposed between the first sleeve portion and the second sleeve portion.

In some embodiments, there is a gap between the sleeve member and a hole wall of the mounting hole.

In some embodiments, the shaft body includes a necking portion, the necking portion is disposed between the first end and the second end, and the waterproof ring is sleeved on the necking portion.

In some embodiments, a material of the sleeve member is Teflon, perfluoroethylene propylene, or polyvinylidene fluoride.

In some embodiments, a thickness of the sleeve member ranges from 0.1 mm to 0.3 mm.

In some embodiments, the circuit board includes a conductive elastic piece, and the conductive elastic piece is in contact with the second end of the shaft body and is electrically connected to the circuit board.

In some embodiments, the circuit board includes a switch, the switch is disposed corresponding to the second end of the shaft body, and when the button member is stressed, the second end of the shaft body abuts against the switch and causes the switch to conduct the circuit board.

In conclusion, according to an embodiment, an electronic device is provided. The sleeve member is sleeved on the shaft body of the button member, and the sleeve member is heated to shrink to tightly wrap the shaft body. In this way, the metal shaft body is prevented from directly being in contact with the metal shell, thereby avoiding a short circuit in a measurement process and also avoiding excess space between the shaft body and the shell, preventing the shaft body from shaking.

DETAILED DESCRIPTION

Figure 1:
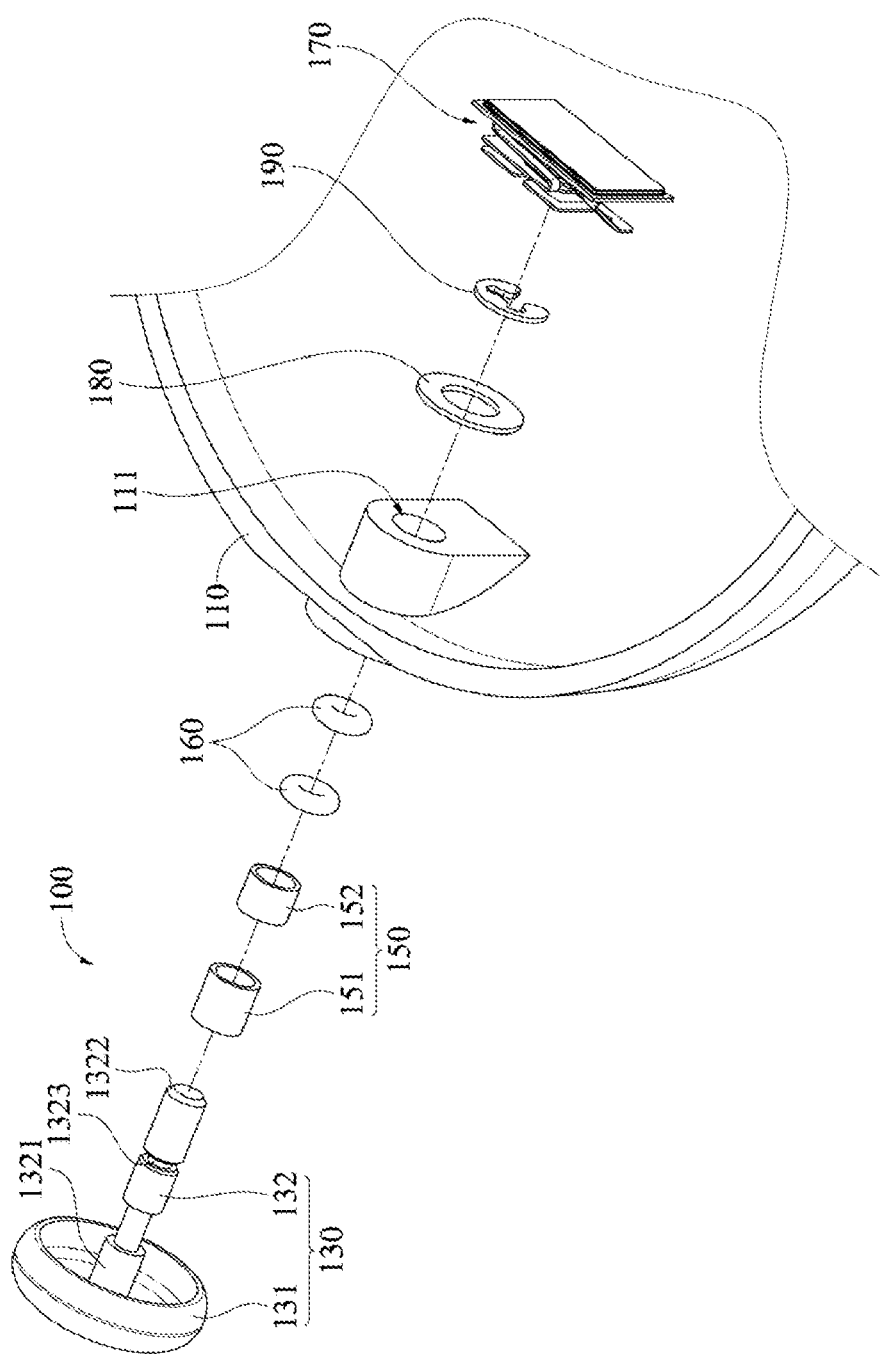
FIG. 1 is a schematic exploded view of an electronic device according to an embodiment.
Figure 2:
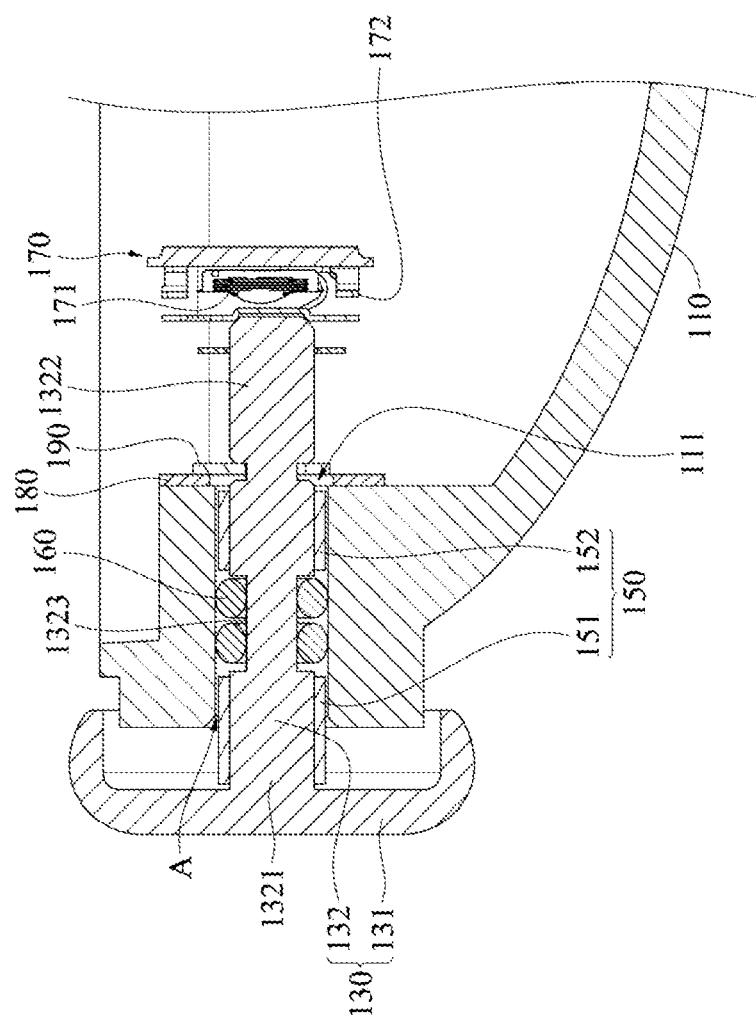
FIG. 2 is a schematic cross-sectional view of an electronic device according to an embodiment.

Refer to FIG. 1 and FIG. 2. FIG. 1 is a schematic exploded view of an electronic device according to an embodiment. FIG. 2 is a schematic cross-sectional view of an electronic device according to an embodiment. An electronic device 100 includes a shell 110, a button member 130, a sleeve member 150, a waterproof ring 160, and a circuit board 170. In this embodiment, the electronic device 100 is, for example, a smart watch. A user touches an end of the button member 130 with a finger, so that an other end of the button member 130 transmits a signal to the circuit board 170 to perform electrocardiogram measurement.

The shell 110 includes a mounting hole 111. As shown in FIG. 1, the mounting hole 111 passes through the shell 110 and is in communication with an inner side and an outer side of the shell 110. In this embodiment, the shell 110 is a shell made of a metal material.

The button member 130 includes a cap 131 and a shaft body 132, the cap 131 is located on an outer side of the shell 110, the shaft body 132 passes through the mounting hole 111, and the shaft body 132 includes a first end 1321 and a second end 1322 that are opposite to each other. As shown in FIG. 2, the button member 130 passes from the outer side of the shell 110 to the inner side of the shell 110 via the mounting hole 111. The first end 1321 of the shaft body 132 is located on the outer side of the shell 110, and the second end 1322 is located on the inner side of the shell 110. In this embodiment, the button member 130 is made of a metal material.

Still referring to FIG. 2, the sleeve member 150 tightly wraps the shaft body 132. In this embodiment, the sleeve member 150 is made of a heat shrinkable plastic material. The sleeve member 150 is sleeved on the shaft body 132.

After heating, the sleeve member 150 shrinks and tightly wraps the shaft body 132, so that the sleeve member 150 is attached to a surface of the shaft body 132. In this way, the assembled shaft body 132 is prevented from being in direct contact with the shell 110. In addition, a gap between the shaft body 132 and a hole wall surface of the mounting hole 111 is prevented from being too large when the shaft body 132 passes through the mounting hole 111. In this embodiment, the sleeve member 150 is made of a fluorine-based material with low friction, such as Teflon, perfluoroethylene propylene, or polyvinylidene fluoride. By using the material with low friction, when the shaft body 132 moves in the mounting hole 111, a movement process of the shaft body 132 is smoother.

The waterproof ring 160 is sleeved on the shaft body 132. As shown in FIG. 2, by filling the gap between the shaft body 132 and the hole wall surface of the mounting hole 111 with the waterproof ring 160, the waterproof effect of the inside and outside of the shell 110 at the mounting hole 111 can be achieved, and the liquid can be prevented from entering the electronic device 100 through the mounting hole 111. In this embodiment, the waterproof ring 160 is made of a rubber material.

The circuit board 170 is disposed inside the shell 110, and the second end 1322 of the shaft body 132 is movably in contact with or away from the circuit board 170. In this way, the user may press an end of the button member 130 with the finger, so that the second end 1322 of the shaft body 132 of the button member 130 is in contact with the circuit board 170 and transmits a signal to perform electrocardiogram measurement.

Specifically, the sleeve member 150 made of the heat shrinkable plastic material is sleeved on the shaft body 132, and the sleeve member 150 is heated to shrink to tightly wrap the shaft body 132. In this way, the metal shaft body 132 is not in direct contact with the metal shell 110, which can avoid a short circuit in a measurement process. In addition, the sleeve member 150 is sleeved, so that the gap between the shaft body 132 and the hole wall surface of the mounting hole 111 is reduced, thereby preventing the shaft body 132 from shaking due to an excessive gap.

Still refer to FIG. 1 and FIG. 2. The electronic device 100 further includes an insulating sheet 180 and a buckle 190. The insulating sheet 180 is sleeved on the second end 1322 of the shaft body 132 that is away from the cap 131 and closely attached on an inner side wall surface of the shell 110. The buckle 190 is sleeved on the second end 1322 and is adjacent to the insulating sheet 180. As shown in FIG. 1 and FIG. 2, the insulating sheet 180 is closely attached on the inner side wall surface of the shell 110 and is located between the buckle 190 and the sleeve member 150 to insulate the inner side wall surface of the shell 110 from the buckle 190. In addition, an outer diameter of the buckle 190 is greater than an inner diameter of the mounting hole 111. Therefore, by sleeving the buckle 190 on the second end 1322 of the shaft body 132, when the button member 130 returns to an original position after being pressed, the shaft body 132 of the button member 130 can be prevented from moving away from the mounting hole 111 to the outside of the shell 110 in an operation process.

As shown in FIG. 2, the sleeve member 150 includes a first sleeve portion 151 and a second sleeve portion 152. The first sleeve portion 151 is adjacent to the first end 1321, the second sleeve portion 152 is adjacent to the second end 1322, and the waterproof ring 160 is disposed between the first sleeve portion 151 and the second sleeve portion 152. The first sleeve portion 151 tightly wraps the first end 1321 of the shaft body 132, and the second sleeve portion 152 tightly wraps a side of the shaft body 132 that is close to the second end 1322, to achieve an insulation effect. In addition, in order to prevent the liquid from entering the electronic device 100 through the gap between the hole wall surface of the mounting hole 111 and the shaft body 132, the waterproof ring 160 is disposed between the first sleeve portion 151 and the second sleeve portion 152 to fill a gap A between the hole wall surface of the mounting hole 111 and the shaft body 132. In this embodiment, there is a gap A between the sleeve member 150 and the hole wall surface of the mounting hole 111 to prevent the sleeve member 150 from being in close contact with the hole wall surface and affecting movement of the shaft body 132.

Further, the shaft body 132 includes a necking portion 1323, the necking portion 1323 is disposed between the first end 1321 and the second end 1322, and the waterproof ring 160 is sleeved on the necking portion 1323. As shown in FIG. 2, the shaft body 132 includes a necking portion 1323 with an outer diameter less than that of the first end 1321 and the second end 1322 to provide enough space to sleeve the waterproof ring 160, so that the waterproof ring 160 is prevented from excessively rubbing the hole wall surface and affecting the movement of the shaft body 132 when the shaft body 132 moves. In another embodiment, a thinner waterproof ring 160 may alternatively be used, which will be described in detail later.

The circuit board 170 includes a conductive elastic piece 172, and the conductive elastic piece 172 is in contact with the second end 1322 of the shaft body 132 and is electrically connected to the circuit board 170. That is to say, the shaft body 132 and the circuit board 170 are in a conductive state through the conductive elastic piece 172. Therefore, when the user touches the button member 130 with the finger, since the shaft body 132, the conductive elastic piece 172, and the circuit board 170 are continuously conductive, the signal is transmitted from the second end 1322 of the shaft body 132 to the conductive elastic piece 172 and then to the circuit board 170 for electrocardiogram measurement.

As shown in FIG. 2, further, the circuit board 170 may further include a switch 171, and the switch 171 is disposed corresponding to the second end 1322 of the shaft body 132. The switch 171 may be used as a switch of other functions such as a confirmation button and a power-on button. When the user presses the button member 130, the second end 1322 of the shaft body 132 abuts against the switch 171, and causes the switch 171 to conduct to the circuit board 170, to enable a relevant function of the switch 171. In this case, since the conductive elastic piece 172 is disposed between the second end 1322 of the shaft body 132 and the circuit board 170, the elastic conductive elastic piece 172 may also be used as a reset element. For example, when the user presses the button member 130, the conductive elastic piece 172 is also pushed at the same time, causing the conductive elastic piece 172 to be compressed and generate a restoring force. Once the user stops pressing the button member 130, the restoring force of the conductive elastic piece 172 pushes the button member 130 to reset and stop pressing the switch 171, to stop the activation of the switch 171.

Figure 3:
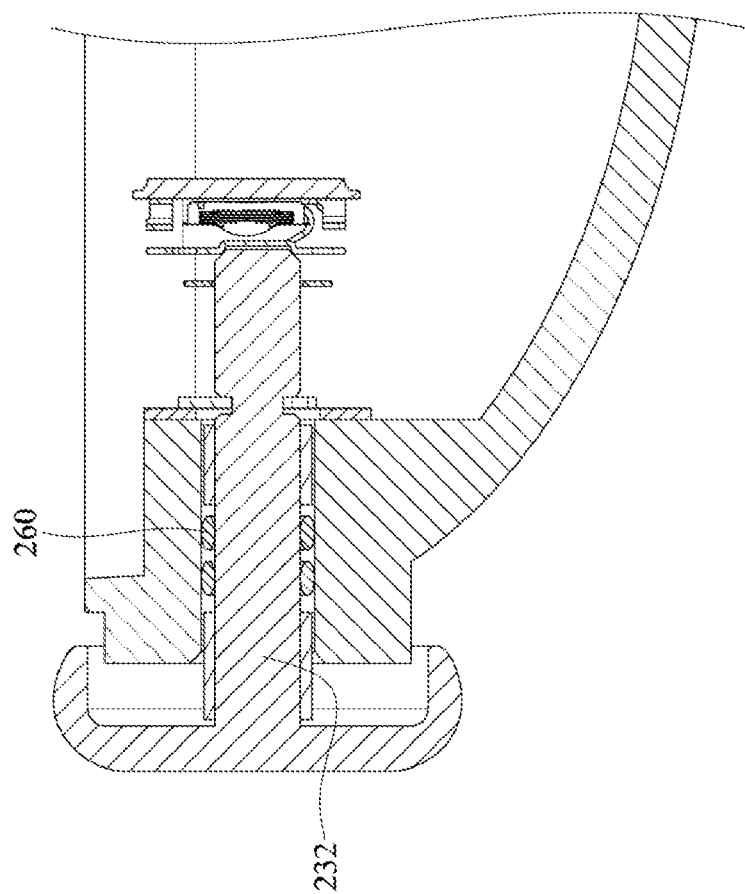
FIG. 3 is a schematic cross-sectional view of an electronic device according to another embodiment.

Referring to FIG. 3, FIG. 3 is a schematic cross-sectional view of an electronic device according to another embodiment. In another embodiment, a thinner waterproof ring 260 is sleeved on a shaft body 232 to avoid excessive friction between the waterproof ring 260 and a hole wall surface, and there is no need to dispose a necking portion on the shaft body 232. In this way, procedures for part production are reduced.

In conclusion, the sleeve member made of the heat shrinkable plastic material is sleeved on the shaft body of the button member, and the sleeve member is heated to shrink to tightly wrap the shaft body. In this way, the metal shaft body is not in direct contact with the metal shell, which can avoid a short circuit in a measurement process. In addition, the sleeve member is sleeved, so that the gap between the shaft body and the hole wall surface of the mounting hole is reduced, thereby preventing the shaft body from shaking due to an excessive gap.

What is claimed is:

1. An electronic device, comprising:
    a shell, made of a metal material, wherein the shell comprises a mounting hole;
    a button member, made of a metal material, wherein the button member comprises a cap and a shaft body, the cap is located on an outer side of the shell, the shaft body passes through the mounting hole, and the shaft body comprises a first end and a second end;
    a sleeve member, made of a heat shrinkable plastic material, wherein the sleeve member wraps the shaft body tightly;
    a waterproof ring, sleeved on the shaft body;
    a circuit board, disposed inside the shell, wherein the second end of the shaft body is movably in contact with or away from the circuit board;
    an insulating sheet; and
    a buckle, wherein the insulating sheet is sleeved on the second end of the shaft body that is away from the cap and closely attached on an inner side wall surface of the shell, and the buckle is sleeved on the second end and is adjacent to the insulating sheet.

2. The electronic device according to claim 1, wherein the sleeve member comprises a first sleeve portion and a second sleeve portion, the first sleeve portion is adjacent to the first end, the second sleeve portion is adjacent to the second end, and the waterproof ring is disposed between the first sleeve portion and the second sleeve portion.

3. The electronic device according to claim 1, wherein there is a gap between the sleeve member and a hole wall of the mounting hole.

4. The electronic device according to claim 1, wherein the shaft body comprises a necking portion, the necking portion is disposed between the first end and the second end, and the waterproof ring is sleeved on the necking portion.

5. The electronic device according to claim 1, wherein a material of the sleeve member is Teflon, perfluoroethylene propylene, or polyvinylidene fluoride.

6. The electronic device according to claim 1, wherein a thickness of the sleeve member ranges from 0.1 mm to 0.3 mm.

7. The electronic device according to claim 1, wherein the circuit board comprises a conductive elastic piece, and the conductive elastic piece is in contact with the second end of the shaft body and is electrically connected to the circuit board.

8. The electronic device according to claim 1, wherein the circuit board comprises a switch, the switch is disposed corresponding to the second end of the shaft body, and when the button member is stressed, the second end of the shaft body abuts against the switch and causes the switch to conduct the circuit board.

* * * * *